United States Patent [19]
Kakibayashi et al.

[11] Patent Number: 5,744,800
[45] Date of Patent: Apr. 28, 1998

[54] DEFECT OBSERVING ELECTRON MICROSCOPE

[75] Inventors: Hiroshi Kakibayashi, Nagareyama; Hisaya Murakoshi, Tokyo; Hidekazu Okuhira, Asaka; Takashi Irie, Musashimurayama; Jiro Tokita, Kawagoe; Keiichi Kanehori, Sayama; Yasuhiro Mitsui, Fuchu, all of Japan

[73] Assignee: Hitachi, Ltd., Tokyo, Japan

[21] Appl. No.: 477,654

[22] Filed: Jun. 7, 1995

[30] Foreign Application Priority Data

Jun. 10, 1994 [JP] Japan ................................ 6-128471

[51] Int. Cl.$^6$ ............................................. H01J 37/26
[52] U.S. Cl. ............................. 250/311; 250/442.11
[58] Field of Search ............................ 250/306, 307, 250/311, 440.11, 442.11

[56] References Cited

U.S. PATENT DOCUMENTS

| | | | |
|---|---|---|---|
| 3,643,091 | 2/1972 | Lucas | 250/442.11 |
| 4,760,265 | 7/1988 | Yoshida et al. | 250/492.2 |
| 4,837,444 | 6/1989 | Ohi | 250/442.11 |

OTHER PUBLICATIONS

Japanese Journal of Applied Physics, vol. 22, No. 6, Jun. 1983, "Direct Observation of Lattice Arrangement in MBE Grown GaAs–AlGaAs Superlattices" Okamoto et al, pp. L367–L369.

Nature, vol. 179, (1957), "Observation of Dislocations in Metals by Means of Moire Patterns on Electron Micrographs", Pashley et al, pp. 752–755.

Transmission Electron Microscopy, pp. 332–337.

*Primary Examiner*—Bruce Anderson
*Attorney, Agent, or Firm*—Fay,Sharpe,Beall,Fagan,Minnich & McKee

[57] ABSTRACT

A transmission electron microscope makes it possible to search for defects without applying an undesirable treatment to a specimen by using a reference specimen prepared separately from a specimen to be observed. A pair of specimen holders detachable from the column of the electron microscope are adjacently arranged at upper and lower stages respectively along an electron beam axis to position the specimens closely to each other in an electron beam illuminating position. The pair of holders can be independently set to or removed from the electron beam illuminating position. The specimen holders include devices for selectively finely adjusting the spacing between the specimens, the angle of the specimen with respect to the electron beam axis and with respect to a plane perpendicular to the electron beam axis.

22 Claims, 10 Drawing Sheets

FIG. 1(a)

$$d = \frac{d1 d2}{d1 - d2}$$

FIG. 1(b)

$$d = \frac{d1 d2}{(d1^2 + d2^2 - 2 d1 d2 \cos\alpha)^{1/2}}$$

DEFECT OBSERVING ELECTRON MICROSCOPE

FIELD OF THE INVENTION

The present invention relates to an electron microscope useful for observing microdefects that occur at a low density in a specimen to be examined.

BACKGROUND OF THE INVENTION

Because of recent advancements in materials science and development in further integration of semiconductor circuits, the demand for evaluation techniques that permit the observation of microdefects in specimens to be examined has increased. In particular, it is becoming increasingly important to detect or observe microdefects in the size of the order of several nm existing in various crystalline materials and semiconductor devices at a low density.

Defects can be observed by a conventional transmission electron microscope (TEM) or a scanning transmission electron microscope (STEM) as described in, for example, "Japanese Journal of Applied Physics", Vol. 22 (1983), pp. L367–L369. According to the method described in this document, the electron microscope image of a specimen to be examined is first observed at a low magnification of 2,000 to tens of thousands to search for a place where defects such as a heterointerface or a grain boundary may exist. When such a place is found, the magnification of the electron microscope is increased up to tens of thousands to hundreds of thousands so that the place of the defect can be observed in detail. When the defect is found, the diameter of the objective aperture is increased to obtain a high resolution mode which then allows precise observation of the defect.

In the above described method, it takes a long time to search for a defect because it is necessary to repeatedly divide the area in which the defect is to be observed at a low magnification into areas observed at a high magnification. Moreover, when there are many places where defects may exist, it is necessary to frequently change magnifications. Furthermore, in the case of the above described method, a defect is searched for by using electron diffraction contrast (a light and shade pattern) mixed in the electron microscope image of the specimen to be examined. Therefore, the defect may be overlooked because the contrast fades unless the incident angle of the electron beam to the specimen to be examined is proper.

In another method, described in "Nature" Vol. 179 (1957), pp. 752–755, it is proposed that a defect be observed by forming, on the specimen to be examined, another crystalline thin film with a lattice spacing slightly different from that of the specimen to be examined and observing a moiré fringe appearing on an image plane of the electron microscope. This method has an advantage in that a defect can be searched for by enlarging it. However, it has a problem in that it is necessary to form a crystalline thin film for generating a moiré fringe on the specimen to be examined. This can produce an undesirable strain on the specimen to be examined due to the formation of the crystalline thin film thereon, and as a result some defects cannot be accurately and efficiently searched for or observed.

SUMMARY OF THE INVENTION

It is a first object of the present invention to provide an electron microscope that is useful for searching for defects without requiring an undesirable treatment to be applied to the specimen to be examined by using a reference specimen that is prepared separately from the specimen to be examined. It is a second object of the present invention to provide an electron microscope with which it is possible to optionally select the optimum defect searching condition corresponding to the crystal structure or composition of the specimen to be examined or the reference specimen to be used.

The above objects of the present invention can effectively be achieved by arranging adjacent one another a pair of specimen holders detachable from the column of an electron microscope at closely spaced upper and lower stages, respectively, along an electron beam axis. Preferably, the pair of specimen holders are disposed according to the invention so that each of them can be independently set into or moved out from an electron beam illuminating position (specimen observing position) so that one specimen holder does not interrupt the observation of one of the specimens that is mounted on the other specimen holder. Moreover, it is preferred that in order to achieve an optimum defect searching condition, the specimen holders be finely adjustable for adjusting the spacing between specimens in the order of several microns, respectively. Further, each of the specimen holders should be capable of setting the angle of the specimens relative to the electron beam axis, and relative to a plane perpendicular to the electron beam axis (angle of rotation about the electron beam axis).

A defect is searched for, according to the invention, by mounting a reference specimen to be examined on one of the specimen holders and a specimen to be examined or observed on the other, however not in any particular order (the order is not significant to the invention). Though the reference specimen can be one of various crystalline materials in principle, it is actually preferable to select a crystalline material with the same composition or crystalline structure as the specimen to be examined or observed. Moreover, it is preferable to select a reference material with a known crystal structure that is free from defects. Furthermore, it is preferable to select a reference material that is less than 100 nm in thickness, so that the difference in lattice spacing between the reference material and the specimen to be examined to be observed can be kept to preferably less than 1%.

Figure 1A:
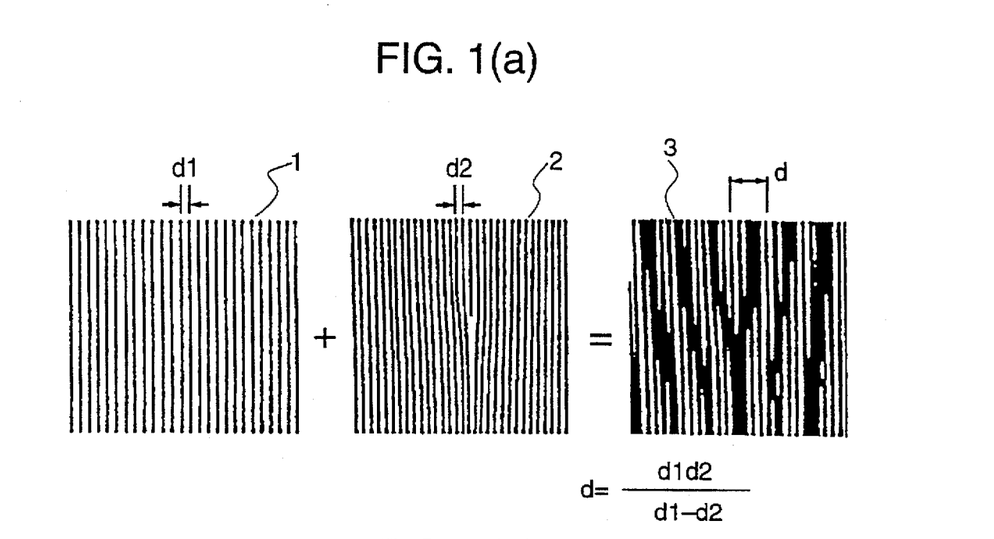
FIGS. 1(a)–(c) are conceptual views useful for explaining the principle of the electron microscope of the present invention.

The principle of the electron microscope of the present invention is conceptually described below by referring to FIGS. 1(a)–(c). It is assumed that a reference specimen 11 and a specimen to be examined or observed 12 having lattice spacings of $d_1$ and $d_2$, respectively, are superimposed so that their crystal planes become parallel to each other and so that they are placed in the electron beam illuminating position of a transmission electron microscope. When an electron beam is applied to both specimens, a moiré image 3 is formed due to interference between the electron microscope image 1 of the reference specimen with lattice spacing $d_1$ and an electron microscope image 2 of the specimen to be examined with lattice spacing $d_2$ (both images are shown as fringes simulated as lines of grating) is imaged on the image plane of the electron microscope (below the back focal plane 15 in FIG. 1(c)) as shown in FIG. 1(a). Specifically, with reference to the schematic representation of FIG. 1(c), the moiré fringe image is formed by the double diffraction interference between the transmitted electron beam 16 and the diffracted electron beams 17–19, diffracted by the specimens as shown in the figure. After passing through the specimens, the transmitted and diffracted electron beams are focused by an objective lens 14 onto the back focal plane 15, and thereafter these electron beams form an electron microscope image onto the image plane interfering each other.

As an example, the specimen 2 shows a dislocation as the defect. The pitch "d"0 of the moiré fringe image 3 in FIG. 1(a) can be shown by the following expression.

$$d = d_1 d_2 / |d_1 - d_2| \quad (1)$$

Accordingly, the image of the dislocation is enlarged in the moiré fringe image 3.

Figure 1B:
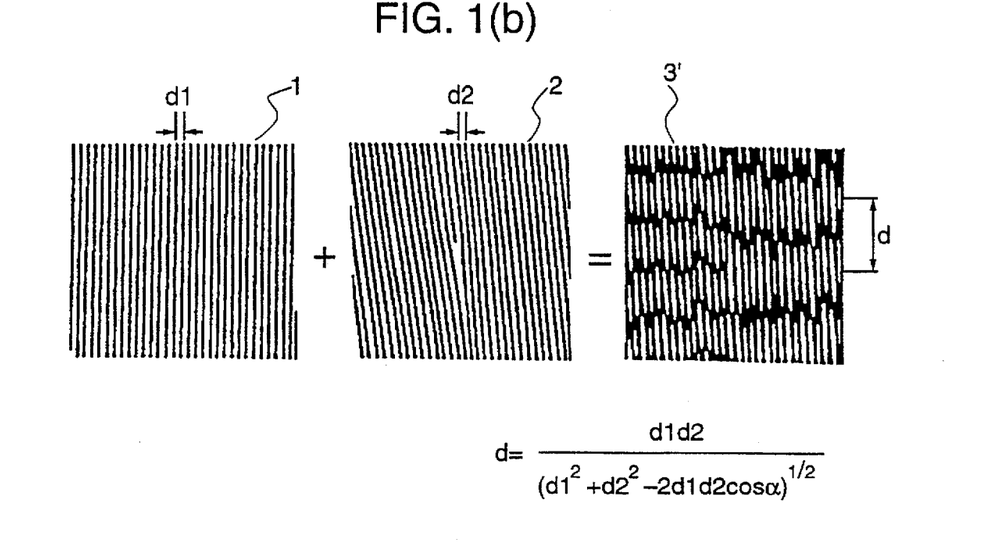
Figure 1C:
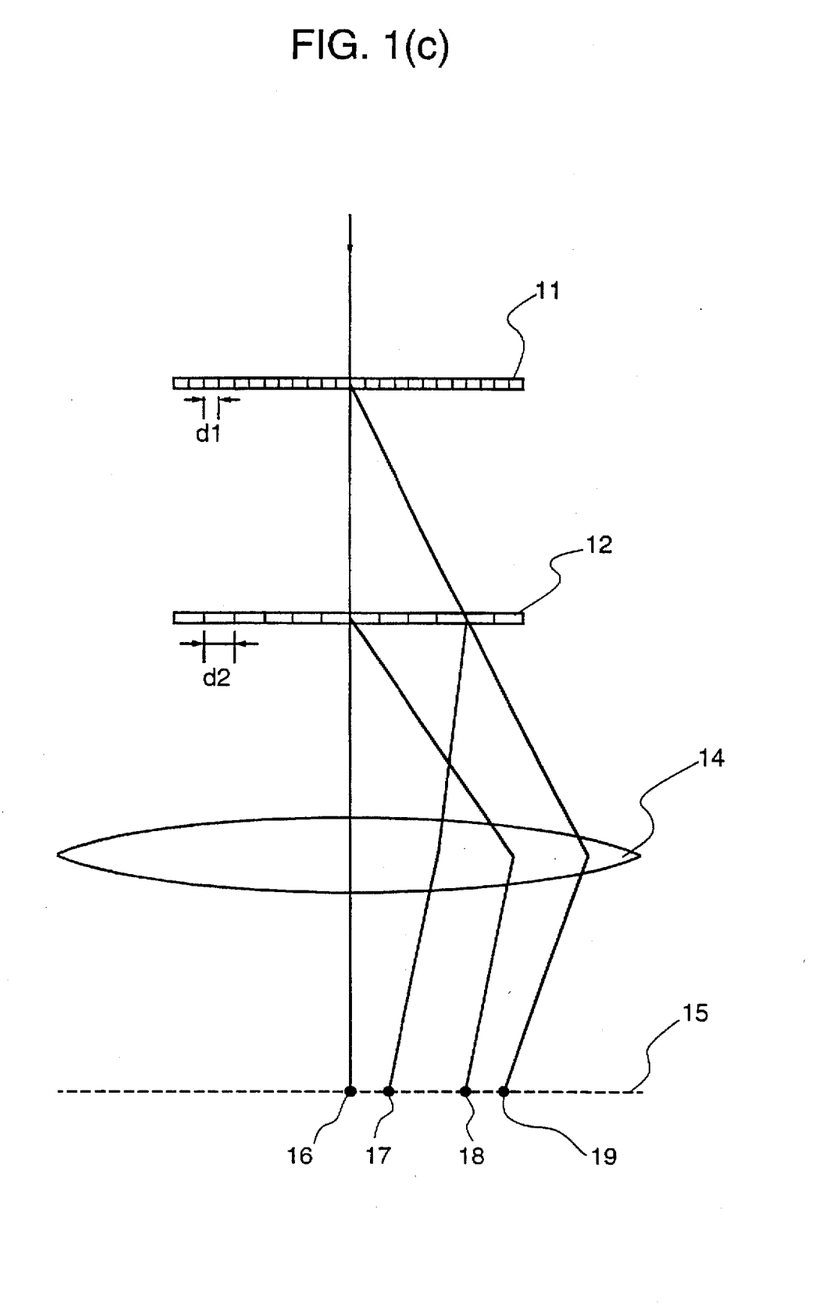

FIG. 1(b) shows a case in which the same reference specimen and a specimen to be examined are superimposed by slightly tilting them in a plane perpendicular to an electron beam axis (rotating one relative to the other about the electron beam axis). In the case of this moiré image 3', moiré fringes appear in the direction approximately perpendicular to the crystal plane (line of grating) of the specimens. The pitch "d" of the resulting moire fringes can be shown by the following expression by assuming the difference in angle between the specimens to be α.

$$d = d_1 d_2 / (d_1^2 + d_2^2 - 2d_1 d_2 \cos\alpha)^{1/2} \quad (2)$$

As clarified from expressions (1) and (2), the ratio ($d/d_2$) of the pitch "d" of the moiré fringes of the lattice spacing $d_2$ of the specimen to be examined increases as the difference ($d_1-d_2$) in the lattice spacing between the specimens and the angle difference α between the crystal planes decreases. This represents that the defect (central portion of the electron microscope image 2) existing in the specimen to be examined is enlarged to appear in the moiré image 3 as a Y-shaped fringe or a discontinuous fringe. Specifically, the magnification ratio of a defect when the lattice spacing of a reference specimen is 0.2 nm increases 10-fold, 101-fold, or 1001-fold when setting the lattice spacing of a specimen to be examined to 0.22 nm, 0.202 nm, or 0.2002 nm respectively. Moreover, the magnification ratio when both specimens have the same lattice spacing ($d_1=d_2$) and the angle difference α is present between the crystal planes of both specimens increases 10-fold, 100-fold, or 1,000-fold when setting the angle difference α to 0.1 rad, 0.01 rad, or 0.001 rad respectively. The magnification ratio when the lattice spacing of the reference specimen is 0.2 nm and that of the specimen to be examined is 0.2002 nm and the angle difference α is 0.001 rad increases 707.5-fold.

When using the electron microscope of the present invention, it is unnecessary to apply special treatment to a specimen to be examined for generating a moiré image, unlike that in the case of the prior art (Nature). Therefore, it is possible, by the present, invention not only to simplify the preparation for observing defects, but also to avoid the problem of causing an undesirable strain to occur in the specimen to be examined by pretreating the specimen before examination. Moreover, by selectively finely adjusting the angle of the specimen's position with respect to the electron beam axis and with respect to the plane perpendicular to the electron beam axis, it is possible to optionally select the optimum defect searching condition (e.g. magnification ratio) in accordance with the crystal structure or composition of a specimen to be examined and that of the reference specimen to be used.

DETAILED DESCRIPTION OF THE PREFERRED EMBODIMENTS

The electron microscope of the present invention is described with reference to FIGS. 2 to 10, wherein like reference numerals represent that the same or similar elements are referred to in the drawings.

Figure 2:
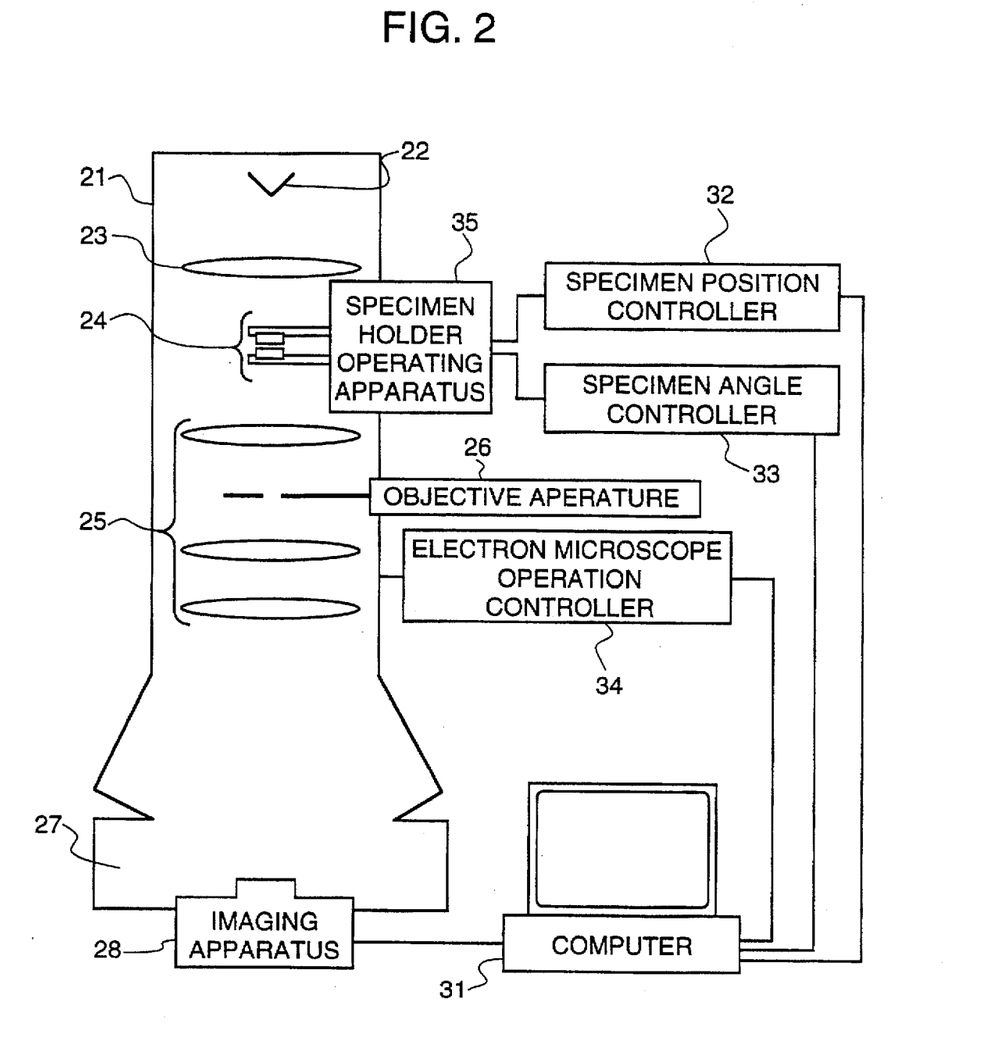
FIG. 2 is an overall block diagram for explaining the first embodiment of the electron microscope of the present invention.
Figure 3:
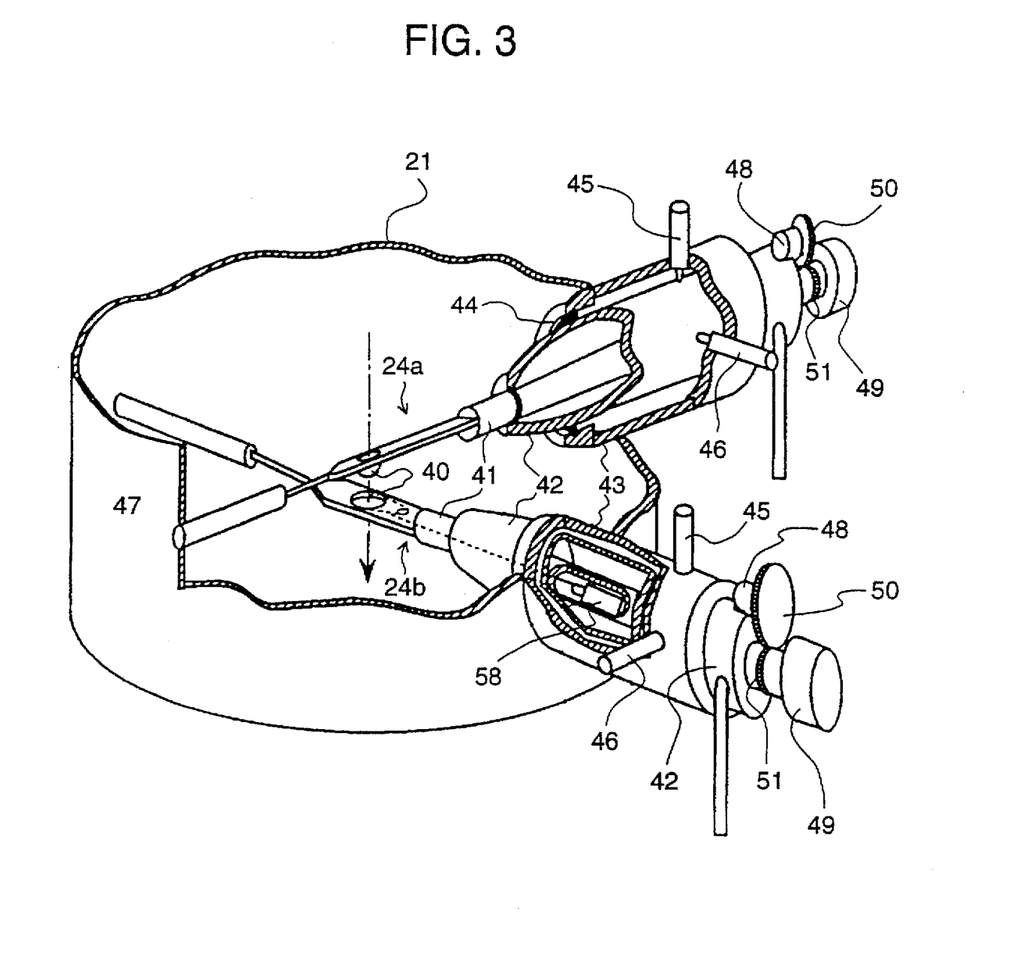
FIG. 3 is a perspective view showing a specific structure of a specimen holder according to a first embodiment of the invention.

FIG. 2 is an overall block diagram showing an embodiment of the electron microscope of the present invention according to a first embodiment thereof. In the column 21 of the electron microscope, an electron gun 22, an illumination lens system 23, a pair of specimen holders 24, an imaging lens system 25, an objective aperture 26, a camera chamber 27, and an imaging apparatus 28 are arranged in order, as shown. An electron beam emitted from and accelerated by the electron gun 22 illuminates the specimens (both the reference specimen and the specimen to be examined) mounted on the pair of specimen holders 24. The electron beam passing through the specimens forms an image on the image detection face (at the image plane) of the imaging apparatus 28 provided in the camera chamber 27 by the imaging lens system 25 and the objective aperture 26. The imaging apparatus 28 is connected to a computer 31, which is connected to a specimen position controller 32, a specimen angle controller 33, and an electron microscope operation controller 34.

According to the invention, the pair of specimen holders 24a and 24b, which are detachable from the column 21, are arranged closely adjacent one another at the upper and lower stages, respectively, along the axis of the electron beam. The specimen holders are connected to a specimen holder operating apparatus 35, respectively, and constituted so as to independently move or rotate each specimen, as described in greater detail hereinafter.

The specimen holder operating apparatus 35 is operated in four types of modes by the specimen position controller 32 and the specimen angle controller 33. In the first mode, the apparatus 35 moves the specimen holders into or out of an electron beam illuminating position. In the second mode, the apparatus 35 finely adjusts the spacing between the specimens, preferably to within several microns of each other. In the third mode, the apparatus 35 finely adjusts the specimen setting angle in a plane perpendicular to the electron beam axis. In the fourth mode, the apparatus 35 finely adjusts the tilting angle of the specimen with respect to the electron beam axis.

The computer 31 processes image data sent from the imaging apparatus 28 and transmits necessary control commands to each of the controllers 32 to 34 in accordance with the processing result. The imaging apparatus 28 can be a well known avalanche-type imaging tube. It is also possible to use a conventional CCD (charge-coupled device) instead of the avalanche-type imaging tube.

FIGS. 3 to 6 show specific structural examples of specimen holders used in the first embodiment of the present invention. In this embodiment, top specimen holder 24a and bottom specimen holder 24b are adjacently arranged so that they are separated by a small distance in respective horizontal plane (perpendicular to the electron beam axis). Preferably the specimen holders are arranged orthogonal to one another about the column 21, however any separation angle can be used that permits the specimen holders to be mounted on the column and used without interfering with one another. Each specimen holder 24a, 24b has an operating rod 41 having a specimen mounting aperture 40 at its front half portion and a support cylinder 42 for storing and supporting the operating rod 41 so that it can be detached (see FIG. 4). The support cylinder 42 is set to a flange 43 formed on a part of the column 21 through a vacuum seal 44. Two actuators 45 and 46 mounted on a flange 43 can be actuated for fine tilting movement of the support cylinder 42 about the seal 44 in a horizontal plane (perpendicular to an electron beam axis) or in a vertical plane (including the electron beam axis. Another actuator 47 mounted on the inner wall of the column 21 facing the specimen holders 24a and 24b supports the front end of the operating rod 41 and provides fine movement of the rod 41 along its axial direction. A pulse motor 48 for rotating the operating rod 41 in small increments about its axis is mounted on the support cylinder 42. The actuators 45 to 47 form a part of the specimen holder operating apparatus 35 shown in FIG. 2. The actuators 45 to 47 are constituted by combining a commercially available pulse motor and an encoder, for example.

Figure 4:
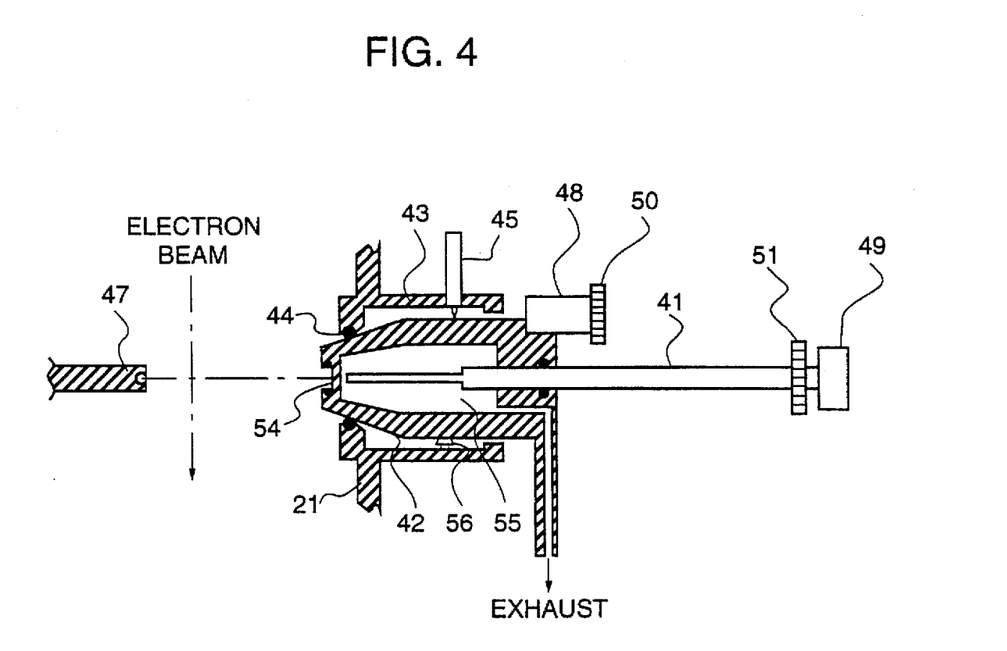
FIG. 4 is a sectional view for explaining the procedure for setting a specimen in the holder of FIG. 3.

The operating rod 41, as shown in FIG. 4, can be inserted into the column 21 through the support cylinder 42 or extracted from the column 21 by manipulating an operating handle 49 located at the rear end of the rod 41 (by hand). Moreover, when the rod 41 is inserted into the column 21, the pulse motor is connected for driving the rod 41 through rotary gears 50 and 51. A gate valve 54 for maintaining the vacuum state of the column 21 after extracting the operating rod 41 is provided at the end of the support cylinder 42 facing the inside of the column 21. In use, first the cavity 55 is evacuated while the specimen holders 24a and 24b are in the position shown in FIG. 4 (in which the front half portion of the operating rod 41 is inserted into the cavity 55 of the support cylinder 42). Then, once the vacuum degree in the cavity 55 approaches the vacuum degree in the column 21, the handle 49 is manipulated to insert the operating rod 41 within the column 21 until the front end of the rod 41 contacts the actuator 47.

Figure 5:
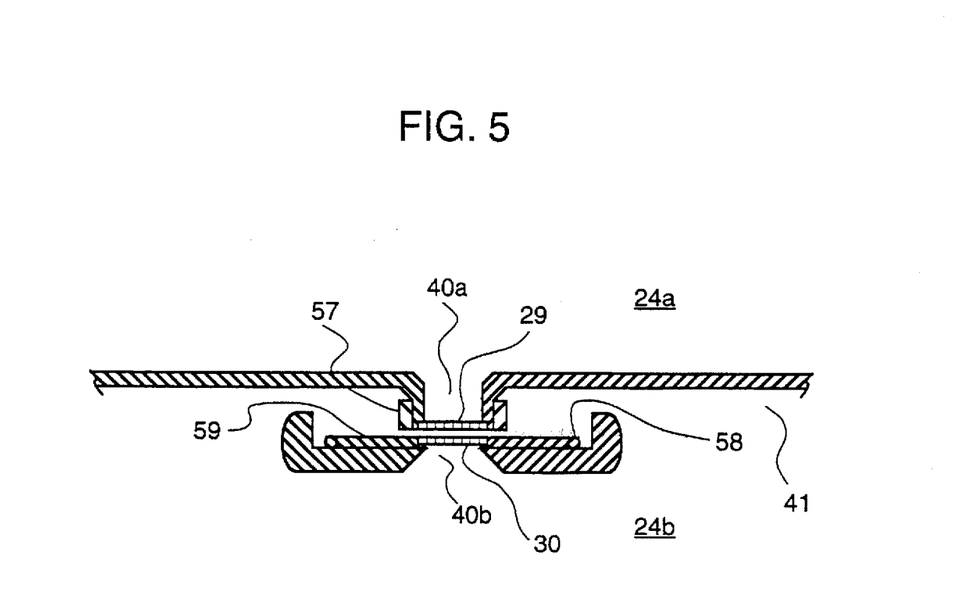
FIG. 5 is a schematic sectional view showing details of the structure of the specimen holders including the specimen mounting apertures of the specimen holders of FIG. 3.

FIG. 5 shows the positional relation between the pair of specimen holders 24a and 24b set in a predetermined position suitable for being illuminated by the electron beam. In the case of the electron microscope of the present invention, it is necessary to set the spacing between a specimen to be examined and a reference specimen to 10 µm or less, and preferably to within 2–3 µm, when observing defects in the specimen to be examined. Therefore, the top specimen holder 24a is formed so that a specimen mounting aperture 40a protrudes toward a specimen mounting aperture 40b of the specimen holder 24b. A specimen 29 is mounted on the top specimen holder 24a by a specimen mount 65 having the structure shown in FIGS. 7(a)–(c).

Figure 7A:
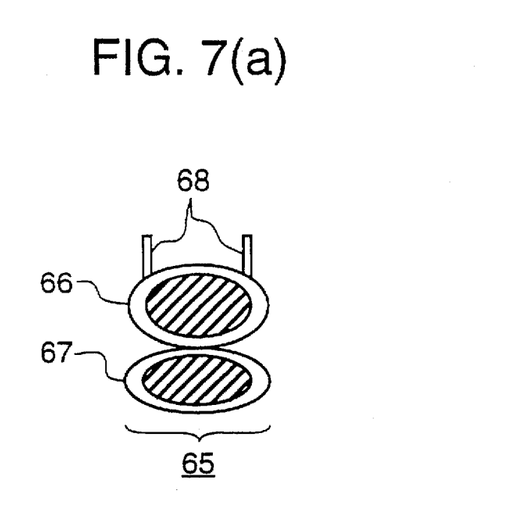
FIGS. 7(a) to 7(b) are perspective views and FIG. 7(c) a sectional view showing a specific example of the specimen mount used in the first embodiment of the invention.
Figure 7B:
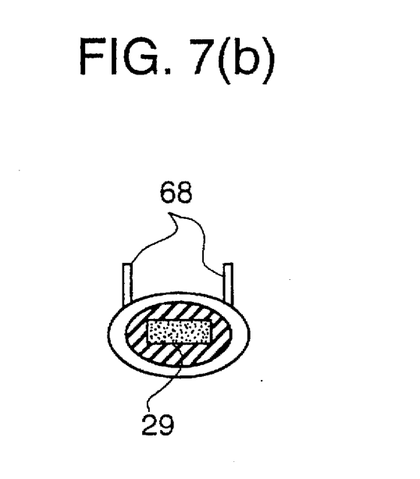
Figure 7C:
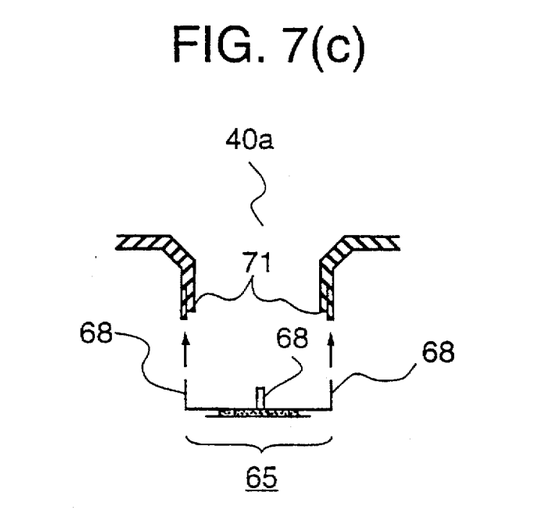

The specimen mount 65, shown in FIGS. 7(a)–(c) comprises two circular mesh members 66 and 67 connected so that they can be opened or closed by a hinge. The specimen 29 is held and secured by the both members. The specimen 29 is mounted on the top specimen holder 24a by fitting a plurality of clamps formed on the periphery of one mesh member 66 into grooves 71 formed on the side wall of the specimen mounting aperture 40a. A specimen 30 (FIG. 5) is mounted on the bottom specimen holder 24b by mounting a specimen mount (not illustrated) having a similar structure without the above clamps on a sample holding pulley 59 set on the specimen mounting aperture 40b.

The spacing between the specimens 29 and 30 is adjusted by operating the actuator 45 (see FIGS. 3 and 4) and finely tilting the support cylinder 42 about the seal 44 in a vertical plane. In FIG. 4, a spring 56 is shown that is mounted in a gap between the cylinder 42 and the flange 43 opposite the actuator 45 (a gap between the outer wall of the support cylinder 42 and the inner wall of the flange 43). Optionally, the spacing between specimens is monitored or measured by a swirl-current-type position sensor 57 (see FIG. 5) mounted about the outer periphery of the specimen mounting aperture 40a of the top specimen holder 24a.

The position of the operating rod 41 in a horizontal plane (perpendicular to the electron beam axis), and correspondingly the position of the specimen supported thereby, in directions perpendicular to the operating rod 41 are adjusted by operating the actuator 46 and finely rocking or tilting the support cylinder 42 about the seal 44 in a horizontal plane. Though not illustrated in detail, a spring, similar to spring 56 shown in FIG. 5, is positioned in a gap located at the opposite side to the actuator 46 in order to balance the support cylinder 42. The position of a specimen in the axial direction of the operating rod 41 is adjusted by operating the actuator 47. By adjusting the position of the specimen with actuators 46 and 47, the specimen can be searched for defects.

The specimen setting angle with respect to the plane perpendicular to the electron beam axis can be finely adjusted by operating the pulse motor 48. The specimen setting angle in a horizontal plane (rotation about the electron beam axis) can be finely adjusted by a specimen rotating device 58 built in the operating rod 41 of the bottom specimen holder 24b.

Figure 6:
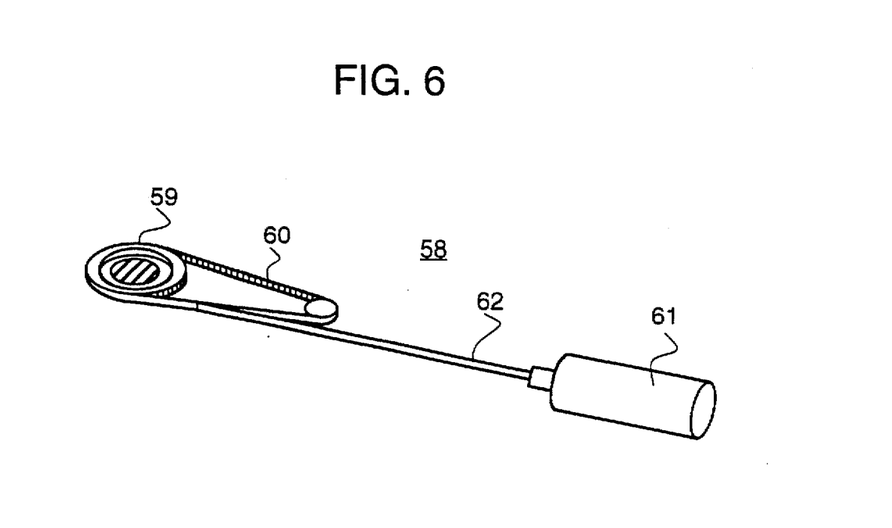
FIG. 6 is a perspective view showing a specific example of the specimen rotating device used in the first embodiment of the invention.

The device 58, as shown in FIG. 6, has a sample holding pulley 59, a belt 60 wound around the pulley 59, an actuator 61, and a wire 62 joined to the belt 60 for transmitting the reciprocating movement of the actuator 61 to the belt 60. The actuator 61 forms part of the specimen holder operating apparatus 35 shown in FIG. 1 together with the actuators 45 to 47 and the pulse motor 48, which can be constructed by combining a commercial pulse motor and an encoder, for example.

The following description sets forth the procedure followed for detecting defects on a specimen to be examined according to a method using the electron microscope of the present invention. It is preferable to observe an electron diffraction image of a reference specimen and obtain the lattice spacing and angle of the reference specimen by the computer 31 before observing defects in the (other) specimen, the specimen to be examined. A specimen to be examined is mounted on either of the top specimen holder 24a or the bottom specimen holder 24b and the reference specimen is mounted on the other specimen holder. In the following description, the specimen to be examined is mounted on the top specimen holder 24a and the reference specimen is mounted on the bottom specimen holder 24b, but the order is not significant to the invention and can be reversed.

Only the top specimen holder 24a (with a specimen to be examined) is first inserted into the column 21 to search the entire specimen to be examined by an electron microscope at a low magnification. If any particularly noticeable structure (heterointerface or grain boundary where a defect may exist) is found, the structure is moved to the center of the visual field. The electron diffraction image of the specimen to be examined in the visual field is obtained from the imaging apparatus 28. The lattice spacing and angle of the specimen to be examined are computed using the image processing software of the computer 31 and the data obtained thereby is recorded in the computer 31.

Then, the bottom specimen holder 24b with the reference specimen is inserted into the column 21 to position the reference specimen in close proximity with the specimen to be examined so that the spacing between them approaches several microns or less (preferably 2–3 microns). In this state, wherein the specimens are positioned in the electron beam illuminating position, the electron microscope images of both of the specimens are imaged at low magnification to produce a moiré image that appears on the image detection face of the imaging apparatus 28. To set the magnification ratio of the defects shown in the moiré image to a desired value, the angle difference αbetween the crystal planes of a specimen to be examined and a reference specimen is computed using the expression (2) in accordance with the data (lattice spacing and angle) of both specimens previously recorded in the computer 31, then the setting angle of both specimens is finely adjusted in a horizontal plane in accordance with the computed result. This adjustment can be made by transmitting a control command from the computer 31 to the specimen holder operating apparatus 35 through the specimen rotation controller 33.

Defects are searched for by operating the actuators 46 and 47 while keeping the electron microscope at a low magnification and moving the specimen to be examined relative to the reference specimen. It is possible to automatically decide whether a defect exists by comparing moiré fringe patterns obtained through the search with a standard pattern (a moiré fringe pattern in an area free from a defect) previously recorded in the computer, 31 one by one by the computer 31, i.e. by dividing the area to be searched or examined into a plurality of discrete areas automatically examined by comparison with the standard pattern one after the other under control of the computer. This permits low density defects that are small in size, for example in the order of several nm or less, to be located and examined automatically. When the computer 31 detects a moire fringe pattern showing that a defect exists in the observation field, it transmits a control command for stopping the movement of the specimen to be examined to the specimen position controller 32.

When the computer 31 detects the existence of a defect, the bottom specimen holder 24b is removed from an electron beam illuminating position (observation field of an electron microscope) by operating the handle 49, for example, to precisely observe the defect by setting the electron microscope to the high-magnification high-resolution mode. A high-resolution image can be obtained by removing the objective aperture 26 from an electron beam axis or changing the aperture 26 to an aperture corresponding to 0.1 to 0.2 nm or less in a reciprocal space.

Figure 8:
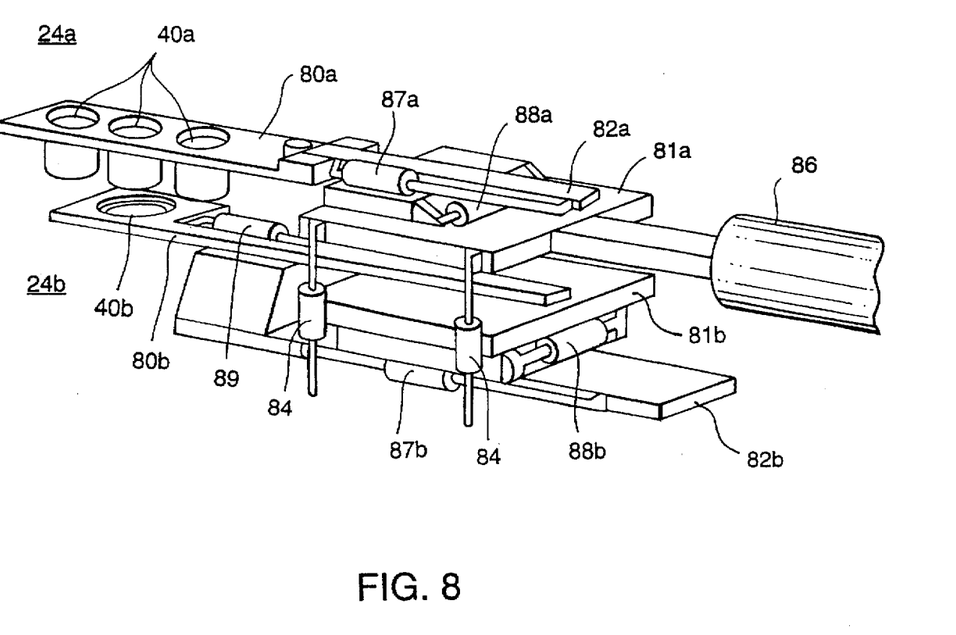
FIG. 8 is a perspective view of the second embodiment of the electron microscope of the present invention.
Figure 9A:
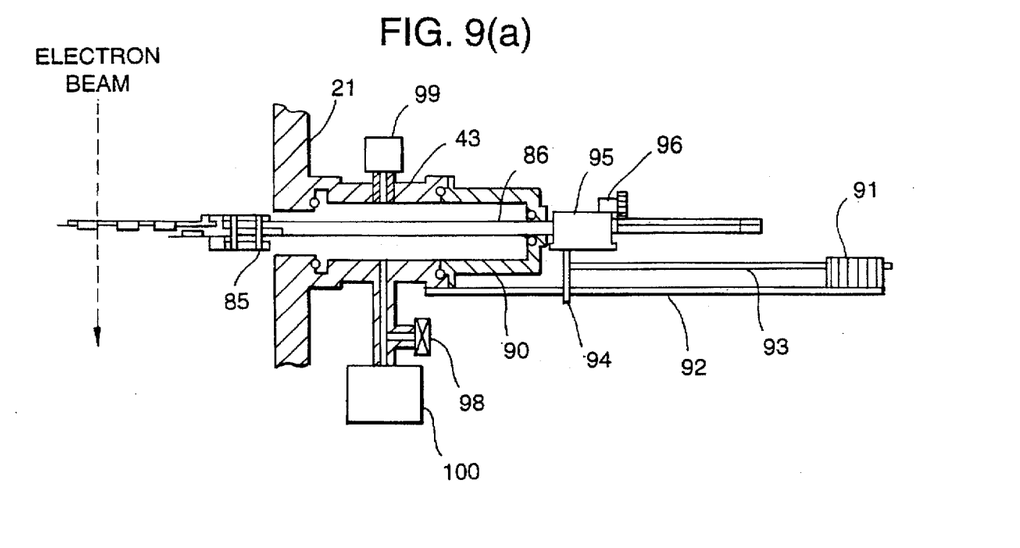
FIGS. 9(a) and 9(b) are sectional views of a specimen holder for the electron microscope of the present invention according to the second embodiment.
Figure 9B:
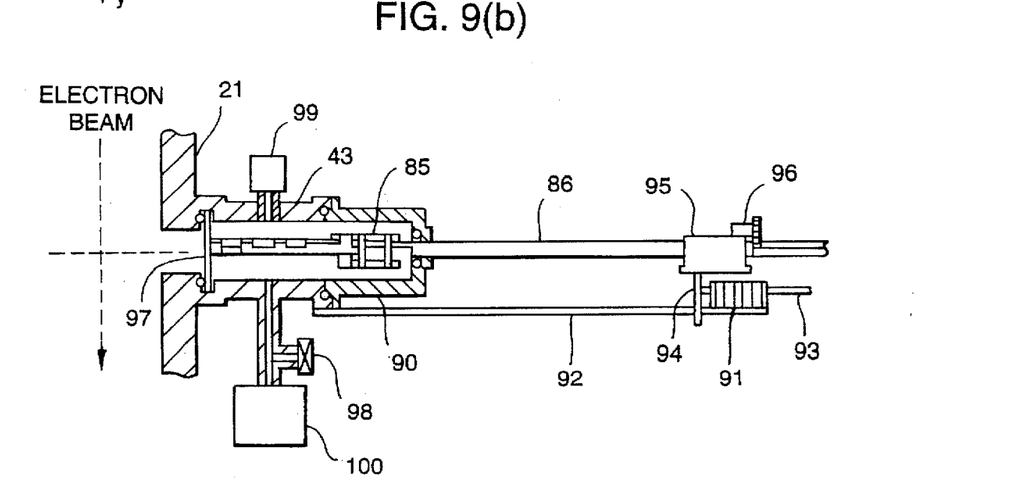
Figure 10:
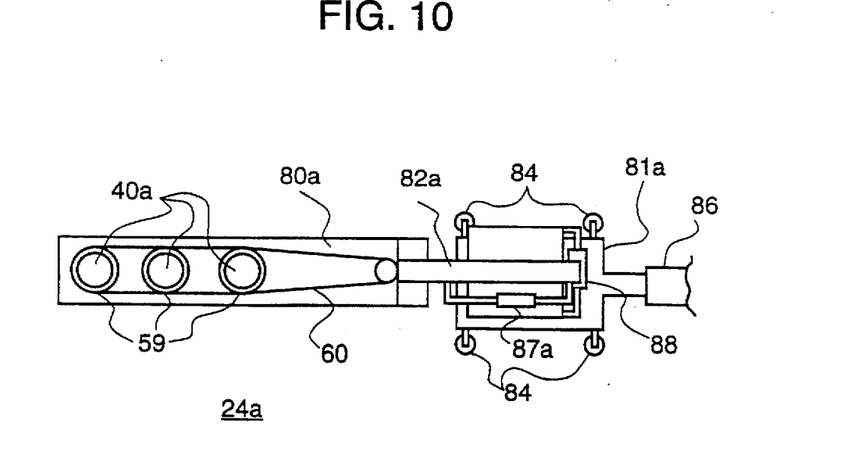
FIG. 10 is a top view showing a specific example of the specimen rotating device used in the second embodiment of the present invention.

FIGS. 8 to 10 show a second embodiment of the present invention. In the case of this embodiment, a pair of specimen holders 24 are arranged in parallel in planes along an electron beam axis passing perpendicularly thereto as shown in FIG. 8. A top specimen holder 24a comprises an upper supporting plate 80a in which three specimen mounting apertures 40a are formed in the axial direction and a bottom specimen holder 24b comprises a lower specimen supporting plate 80b in which a specimen mounting aperture 40b is formed.

The upper supporting plate 80a is connected to an upper operating stage 81a slidable in the axial direction (hereafter referred to as the "X direction") and the direction perpendicular to the axis (hereafter referred to as the "Y direction"). The lower supporting plate 80b is connected to a base 83 provided at the front end of an operating rod 82b slidable in the X direction and moreover the operating rod 82b is connected to a lower operating stage 81b slidable in the X and Y directions. The upper operating stage 81a and the lower operating stage 81b are connected to each other through four spacing adjustment actuators 84. These components constitute a specimen holding unit 85 as a whole. The upper operating stage 81a is connected to a common manipulator 86. Symbols 87a and 88a represent actuators for moving the upper operating stage 80a in the X or Y direction and 87b and 88b represent actuators for moving the lower supporting plate 80b in the X or Y direction. Symbol 89 represents an actuator for moving the lower supporting plate 80b in the X direction on the operating rod 82b.

The specimen holding unit 85 shown in FIG. 8 is positioned in the electron microscope according to the procedure shown in FIGS. 9(a)–(b). In the case of this embodiment, the specimen holding unit 85 is inserted into the column 21 through the flange 43 and thereafter set in the flange 43 by using a bell-shaped chamber 90. A manipulation cylinder 91 is mounted on a part of the flange 43, and has a piston 93. A slider 94 is provided at the end of piston 93. A specimen moving actuator 95 and a specimen rotating pulse motor 96 travel with the slider 94. Preferably, pulse motor 96 is mounted on the actuator.

The specimen holding unit 85 is set into position for permitting the specimen to be illuminated by the electron beam by first exhausting the chamber 90 while the holding unit is in the position shown in FIG. 9(b) and thereafter opening the gate valve 97 to operate the manipulation cylinder 91. When the cylinder 91 operates, the slider 94 secured to the piston 93 moves to the left, as shown in the drawing, along a guide rail 92 pushing the common manipulator 86 by way of the actuator 95 to reach the position shown in FIG. 9(a) (specimen observing state). Specimens are changed by removing the bell-shaped chamber 90 from the flange 43 under the state in FIG. 9(b).

The adjustment of the specimen position and movement of the specimen after the specimen holding unit 85 is set in the position shown in FIG. 9(a) are performed by operating the actuators 87a, 88a, 87b, and 88b (see FIG. 8). The setting of the angle of the specimen with respect to the electron beam axis is adjusted by operating the pulse motor 96 (see FIG. 9).

This embodiment uses an upper supporting plate 80a that is provided with three specimen mounting apertures 40a. Therefore, it is possible to efficiently observe three specimens by setting the specimen holding unit 85 once and thereafter changing the specimens. The three specimens are changed by operating the actuator 89 and making the specimen mounting aperture 40b of the lower supporting plate 80b selectively face any one of the three specimen mounting apertures 40a of the upper supporting plate 80a.

The angle of the specimen (rotational angle) is set and adjusted in the horizontal plane by operating the pulse motor 95, which simultaneously rotates all three sample holding pulleys 59 through the belt 60.

In accordance with the embodiments of the present invention it is possible to efficiently observe and/or automatically search for low-density crystal defects or lattice strains having a size in the order of several nm or less in various materials or devices with a low-magnification image in a short time. Therefore, it is possible to perform the observation of high-resolution images of an extremely small number of micro-defects or microlattice strains existing in a material with a very high purity and atomic position order efficiently and accurately in a short amount of time.

Further, the present invention makes it possible to use a reference specimen prepared separately from a specimen to be examined in performing a search for defects without applying undesirable treatment to the specimen to be examined. Because it is possible to optionally select the optimum defect searching condition corresponding to the crystal structure or composition of a specimen to be examined and a reference specimen to be used, low density defects can be accurately located at low magnification.

While preferred embodiments have been set forth with specific details, further embodiments, modifications and variations are contemplated according to the broader aspects of the present invention, all as determined by the spirit and scope of the following claims.

We claim:

1. A transmission electron microscope for detecting defects in one specimen relative to a reference specimen, comprising:
    an electron gun for electron beam emission;
    a first electron lens system for illuminating an electron beam emitted by said electron gun to a specimen illuminating position;
    a second electron lens system for focusing the electron beam passing through the specimen onto a predetermined image plane;
    a pair of detachable specimen holders adjacently arranged at upper and lower stages separated by a small distance respectively along an electron beam axis for positioning respectively held specimens along the electron beam axis at a same time; and
    means for positioning specimens held by said specimen holders into the electron beam illuminating position independently of each holder.

2. The transmission electron microscope according to claim 1, wherein the pair of specimen holders are in planes that are perpendicular to the electron beam axis.

3. The transmission electron microscope according to claim 1, wherein the pair of specimen holders are in parallel with each other in planes along the electron beam axis.

4. The transmission electron microscope according to claim 1, wherein the specimen holder operating means includes means for selectively finely adjusting a spacing between specimens and an angular position of specimens with respect to the electron beam axis and with respect to a plane perpendicular to the electron beam axis.

5. The transmission electron microscope according to claim 1, wherein the specimen holder operating means includes means for moving a specimen mounted on one specimen holder relatively to a specimen mounted on the other specimen holder in planes that are perpendicular to an electron beam axis.

6. The transmission electron microscope according to claim 1, wherein each of the specimen holders has at least one specimen mounting aperture and means for selectively positioning one of the specimen mounting apertures of one said specimen holder in alignment with a specimen mounting aperture of the other of said specimen holders.

7. A transmission electron microscope for observing defects in a specimen to be examined, comprising:
    an electron gun for electron beam emission;
    a first electron lens system for illuminating an electron beam emitted by said electron gun to a specimen illuminating position;
    a second electron lens system for focusing the electron beam passing through the specimen onto a predetermined image plane;
    a pair of detachable specimen holders adjacently arranged at upper and lower stages separated by a small distance respectively along an electron beam axis, wherein a first one of said holders holds a specimen to be examined for defects and a second one of said holders holds a reference specimen free from defects; and
    means for independently positioning specimens held by said first and second specimen holders into the electron beam illuminating position to create a moiré fringe at said image plane that magnifies defects in a specimen to be examined.

8. The transmission electron microscope according to claim 7, wherein said first and second specimen holders are in planes that are perpendicular to the electron beam axis.

9. The transmission electron microscope according to claim 7, wherein said first and second specimen holders are in parallel with each other in planes along the electron beam axis.

10. The transmission electron microscope according to claim 7, wherein the specimen holder operating means includes means for selectively finely adjusting a spacing between specimens held in said first and second specimen holders and an angular position of the specimens with respect to the electron beam axis and with respect to planes that are perpendicular to the electron beam axis.

11. The transmission electron microscope according to claim 7, wherein the specimen holder operating means includes means for moving a specimen mounted on one of said first and second specimen holders relative to a specimen mounted on the other of said first and second specimen holders in planes that are perpendicular to the electron beam axis.

12. The transmission electron microscope according to claim 7, wherein each of said first and second specimen holders has at least one specimen mounting aperture and means for selectively positioning one of the specimen mounting apertures of one of said first and second specimen holders in alignment with a specimen mounting aperture of the other of said first and second specimen holders.

13. A method for observing defects in a specimen to be examined with a transmission electron beam microscope, comprising:
    emitting an electron beam from an electron gun through a first electron lens system for illuminating specimens held in a specimen illuminating position;
    focusing the electron beam passing through the specimen illuminating position onto a predetermined image plane with a second electron lens system;
    providing a pair of detachable specimen holders adjacently arranged at upper and lower stages separated by a small distance respectively along an electron beam axis, wherein a first one of said holders holds a specimen to be examined for defects and a second one of said holders holds a reference specimen free from defects; and independently positioning specimens held by said first and second specimen holders into the electron beam illuminating position to create a moiré fringe at said image plane that magnifies defects in a specimen to be examined.

14. The method according to claim 13, wherein said first and second specimen holders are provided in planes that are perpendicular to the electron beam axis.

15. The method according to claim 13, wherein said first and second specimen holders are provided in parallel with each other in planes along the electron beam axis.

16. The method according to claim 13, further including selectively finely adjusting a spacing between specimens held in said first and second specimen holders and an angular position of the specimens with respect to the electron beam axis and with respect to planes that are perpendicular to the electron beam axis.

17. The method according to claim 13, further including moving a specimen mounted on one of said first and second specimen holders relative to a specimen mounted on the other of said first and second specimen holders in planes that are perpendicular to the electron beam axis.

18. The method according to claim 13, further including selectively positioning one of a plurality of specimen mounting apertures of one of said first and second specimen holders in alignment with a specimen mounting aperture of the other of said first and second specimen holders.

19. A system for searching for defects in a specimen using a transmission electron microscope, comprising:

an electron gun for electron beam emission;

a first electron lens system for illuminating an electron beam emitted by said electron gun to a specimen illuminating position;

a second electron lens system for focusing the electron beam passing through the specimen onto a predetermined image plane;

means for controlling the magnification of the electron microscope;

a pair of detachable specimen holders adjacently arranged at upper and lower stages separated by a small distance respectively along an electron beam axis, wherein a first one of said holders holds a specimen to be examined for defects and a second one of said holders holds a reference specimen free from defects;

means for independently positioning specimens held by said first and second specimen holders into the electron beam illuminating position to create an observation moiré fringe at said image plane that magnifies defects in a specimen to be examined, including moving the specimen to be examined relative to the reference specimen while keeping the electron microscope at a low magnification with said magnification controlling means;

means for deciding whether a defect exists in the specimen to be examined by comparing patterns of the observation moiré fringe with a standard pattern a moiré fringe pattern from defects; and means connected to said positioning means for stopping the movement of the specimen to be examined when said defect determining means determines that a defect exists.

20. The system for searching for defects in a specimen according to claim 19, further including means connected to said deciding means for commanding said magnification control means to increase the magnification of said electron microscope from said low magnification to a higher magnification for observing the detected defect.

21. The system for searching for defects in a specimen according to claim 19, further including means for setting a magnification ratio of defects shown in the observation moiré image to a predetermined value based upon an angle difference $\alpha$ between the crystal planes of a specimen to be examined and a reference specimen and a difference in lattice spacing for of a specimen to be examined and a reference specimen.

22. The system for searching for defects in a specimen according to claim 19, wherein said means for positioning specimens systematically positions a specimen to be examined relative to the reference specimen for observing discrete areas of an entire area of a specimen to be examined and wherein said means for deciding decides whether a defect exists in the specimen to be examined in each of said discrete areas whereby the entire area of the specimen to be examined is searched for defects.

\* \* \* \* \*